US010056039B2

(12) United States Patent
Nagayama et al.

(10) Patent No.: US 10,056,039 B2
(45) Date of Patent: Aug. 21, 2018

(54) ARRAY SUBSTRATE AND ROW SHARE MODULE OUTSIDE OF A DISPLAY AREA AND OUTPUT PULL-UP/PULL-DOWN MODULE WITHIN THE DISPLAY AREA

(71) Applicant: Boe Technology Group Co., Ltd., Beijing (CN)

(72) Inventors: Kazuyoshi Nagayama, Beijing (CN); Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 14/894,002

(22) PCT Filed: May 11, 2015

(86) PCT No.: PCT/CN2015/078676
§ 371 (c)(1),
(2) Date: Nov. 25, 2015

(87) PCT Pub. No.: WO2016/107043
PCT Pub. Date: Jul. 7, 2016

(65) Prior Publication Data
US 2016/0358551 A1 Dec. 8, 2016

(30) Foreign Application Priority Data
Jan. 4, 2015 (CN) .......................... 2015 1 0004124

(51) Int. Cl.
G09G 3/30 (2006.01)
G09G 3/3266 (2016.01)
(Continued)

(52) U.S. Cl.
CPC ............. G09G 3/3266 (2013.01); G09G 3/20 (2013.01); G09G 3/32 (2013.01); G09G 3/3258 (2013.01);
(Continued)

(58) Field of Classification Search
CPC .. G09G 3/30; G09G 3/32; G09G 3/36; G09G 3/3208; G09G 3/3216; G09G 3/3225;
(Continued)

(56) References Cited

U.S. PATENT DOCUMENTS

2008/0079684 A1* 4/2008 Novoselov ........... G09G 3/3677
345/100
2010/0238143 A1* 9/2010 Liu .......................... G09G 3/20
345/204
(Continued)

FOREIGN PATENT DOCUMENTS

| CN | 101625841 | 1/2010 |
| CN | 101762912 | 6/2010 |

(Continued)

OTHER PUBLICATIONS

Office Action from China Application No. 201510004124.1 dated Dec. 16, 2016.
(Continued)

Primary Examiner — Alexander Eisen
Assistant Examiner — Nelson Lam
(74) Attorney, Agent, or Firm — Calfee, Halter & Griswold LLP

(57) ABSTRACT

Embodiments of the invention provide an array substrate and a display device, the array substrate comprises a plurality of pixel units arranged in an array and a plurality of shifting register units, each shifting register unit corresponding to a row of pixel units. A shifting register unit corresponding to pixel units of any row comprises: a row shared module outside of a display area of the array substrate, an input of which is connected with clock signal lines and a gate signal line of pixel units of a previous row, and an output of which is connected with a pull-up control signal line of pixel units of the row thereof and a pull-down control
(Continued)

signal line of pixel units of the row thereof; an output pull-up module within the display area of the array substrate, which is connected to the pull-up control signal line of pixel units of the row thereof and a gate signal line of pixel units of the row thereof; an output pull-down module within the display area of the array substrate, which is connected to the pull-down control signal line of pixel units of the row thereof and the gate signal line of pixel units of the row thereof. Embodiments of the invention can overcome the problem of the gate driver restricting the narrowing for the frame.

16 Claims, 6 Drawing Sheets

(51) Int. Cl.
G09G 3/20 (2006.01)
G09G 3/32 (2016.01)
G09G 3/3258 (2016.01)
G11C 19/28 (2006.01)
H01L 27/12 (2006.01)
H01L 27/32 (2006.01)

(52) U.S. Cl.
CPC ............ G11C 19/28 (2013.01); H01L 27/124 (2013.01); H01L 27/1255 (2013.01); G09G 2300/0809 (2013.01); G09G 2320/0673 (2013.01); H01L 27/3262 (2013.01); H01L 2251/5315 (2013.01)

(58) Field of Classification Search
CPC .. G09G 3/3233; G09G 3/3266; G09G 3/3611; G09G 3/364
USPC ...................... 345/76–83, 87–104; 315/169.3
See application file for complete search history.

(56) References Cited

U.S. PATENT DOCUMENTS

| 2012/0013585 | A1* | 1/2012 | Jang ...................... G11C 19/00 345/208 |
| 2012/0194773 | A1 | 8/2012 | Kim |
| 2013/0033417 | A1* | 2/2013 | Kim ...................... G11C 19/184 345/100 |
| 2013/0321499 | A1* | 12/2013 | Park ........................ G09G 3/20 345/698 |
| 2014/0078124 | A1* | 3/2014 | Chen .................... G09G 3/3266 345/205 |
| 2014/0160000 | A1* | 6/2014 | Ma ....................... G09G 3/3677 345/100 |
| 2014/0320386 | A1* | 10/2014 | Li ......................... G09G 3/3677 345/87 |
| 2014/0372494 | A1* | 12/2014 | Lin ........................... G06F 5/08 708/209 |
| 2016/0071469 | A1* | 3/2016 | Tsai ........................ G09G 3/36 345/98 |
| 2016/0329021 | A1* | 11/2016 | Nagayama ............... G09G 3/36 |
| 2017/0117341 | A1* | 4/2017 | Chen .................... G09G 3/3258 |

FOREIGN PATENT DOCUMENTS

| CN | 103456258 | 12/2013 |
| CN | 104517564 | 4/2015 |

OTHER PUBLICATIONS

Office action from Chinese Application No. 201510004124.1 dated Jul. 4, 2016.
International Search Report and Written Opinion from PCT/CN2015/078676 dated Sep. 11, 2015.
Third Office Action for Chinese Patent Application No. 201510004124.1 dated Apr. 27, 2017.

* cited by examiner

ARRAY SUBSTRATE AND ROW SHARE MODULE OUTSIDE OF A DISPLAY AREA AND OUTPUT PULL-UP/PULL-DOWN MODULE WITHIN THE DISPLAY AREA

RELATED APPLICATIONS

The present application is the U.S. national phase entry of PCT/CN2015/078676, filed May 11, 2015, which claims the benefit of Chinese Patent Application No. 201510004124.1, filed Jan. 4, 2015, the entire disclosures of which are incorporated herein by reference.

FIELD OF THE INVENTION

The present invention relates to the technical field of displaying technology, and in particular to an array substrate and a display device.

BACKGROUND ART

As to the existing technology of gate on array (GOA), a gate driver is typically designed to be located on a circuit board in a non-displaying area at one side or two sides of an array substrate. In the prior art, a frame for obscuring the circuit board is usually used for a display device when packaged, so as to maintain neatness and beauty in appearance. Consequently, for the traditional design of GOA, the gate driver occupies a considerable width of the frame, which goes against narrowing the frame of the display device.

SUMMARY

With respect to the disadvantages in the prior art, embodiments of the invention provide an array substrate and a display device, which may mitigate or avoid the problem of the gate driver restricting the narrowing of the frame.

In one aspect, an embodiment of the invention provides an array substrate comprising a plurality of pixel units arranged in an array and a plurality of shifting register units, each shifting register unit corresponding to a row of pixel units, wherein a shifting register unit corresponding to pixel units of any row comprises:

a row shared module outside of a display area of the array substrate, an input of which is connected with clock signal lines and a gate signal line of pixel units of a previous row, and an output of which is connected with a pull-up control signal line of pixel units of the row thereof and a pull-down control signal line of pixel units of the row thereof;

an output pull-up module within the display area of the array substrate, which is connected to the pull-up control signal line of pixel units of the row thereof and a gate signal line of pixel units of the row thereof;

an output pull-down module within the display area of the array substrate, which is connected to the pull-down control signal line of pixel units of the row thereof and the gate signal line of pixel units of the row thereof.

In an embodiment, the output pull-up module comprises multiple pull-up sub-modules arranged in the pixel units of the row thereof, each pull-up sub-module connecting with the pull-up control signal line of pixel units of the row thereof and the gate signal line of pixel units of the row thereof; the output pull-down module comprises multiple pull-down sub-modules arranged in the pixel units of the row thereof, each pull-down sub-module connecting with the pull-down control signal line of pixel units of the row thereof and the gate signal line of pixel units of the row thereof.

In an embodiment, a column where a pixel unit is provided with the pull-up sub-module of any row also has pixel units provided with the pull-up sub-module in other rows; and a column where a pixel unit is provided with the pull-down sub-module of any row also has pixel units provided with the pull-down sub-module in other rows.

In an embodiment, columns where pixel units are provided with the pull-up sub-module and columns where pixel units are provided with the pull-down sub-module are evenly and alternately distributed within the display area of the array substrate.

In an embodiment, columns where pixel units are provided with the pull-up sub-module and columns where pixel units are provided with the pull-down sub-module are distributed across multiple columns close to one or two side edges of the array substrate.

In an embodiment, in a pixel unit of any row, the pull-up sub-module and the pull-down sub-module are arranged alternately in a plurality of consecutive pixel units; and among two neighboring rows of pixel units, a column where a pixel unit of the previous row is provided with the pull-up sub-module or the pull-down sub-module shifts a predetermined offset of columns towards right or left relative to the column where a pixel unit of the next row is provided with the pull-up sub-module or the pull-down sub-module; and columns where a pixel unit of the first row provided with the pull-up sub-module or the pull-down sub-module exists start from the first column, columns where a pixel unit of the last row is provided with the pull-up sub-module or the pull-down sub-module exists end up with the last column.

In an embodiment, when the display area of the array substrate has an irregular shape, at least one pixel unit among the pixel units of any row is a pixel unit provided with the pull-up sub-module and at least one pixel unit among the pixel units of any row is a pixel unit provided with the pull-down sub-module.

In an embodiment, the pull-up sub-module comprises a pull-up transistor and a capacitor, the gate of the pull-up transistor is connected with the pull-up control signal line of pixel units of the row thereof, one of the source and drain is connected with the gate signal line of pixel units of the row thereof, the other one is connected with a first clock signal line of the clock signal lines, and one end of the capacitor is connected with the pull-up control signal line of pixel units of the row thereof, the other end is connected with the gate signal line of pixel units of the row thereof.

In an embodiment, the pull-down sub-module comprises a pull-down transistor, the gate of the pull-down transistor is connected with the pull-down control signal line of pixel units of the row thereof, and one of the source and drain is connected with a low level line, the other is connected with the gate signal line of pixel units of the row thereof.

In an embodiment, the row shared module comprises a first transistor and a second transistor, wherein the gate of the first transistor is connected to the gate signal line of pixel units of the previous row, one of the source and drain is connected to the pull-up control signal line of pixel units of the row thereof, and the other is connected with the gate signal line of pixel units of the previous row; wherein the gate of the second transistor is connected to the gate signal line of pixel units of the row thereof, one of the drain and source is connected with the low level line, and the other is connected with the pull-up control signal line of pixel units of the row thereof; and wherein a second clock signal line of the clock lines is connected with the pull-down control signal line of pixel units of the row thereof.

In another aspect, a display device is also provided by an embodiment of the invention, which may comprise an array substrate according to any one of the embodiments described above.

In an embodiment, the display device can be a top-emitting organic light emitting diode display device.

As can be seen from embodiments described above, each shifting register unit corresponding to pixel units of any row is divided into three parts, which are a row shared module, an output pull-up module and an output pull-down module. The row shared module is arranged outside of the display area of the array substrate, the output pull-up module and the output pull-down module are arranged within the display area of the array substrate. This arrangement of the row shared module, output pull-up module, and pull-down module is beneficial for reducing the area of the gate driver on the circuit board at one side or two sides of the array substrate, thereby narrowing the frame for obscuring the circuit board. Thus, embodiments of the invention can overcome the problem of the gate driver restricting the narrowing for the frame.

BRIEF DESCRIPTION OF DRAWINGS

In order to explain the technical solutions of embodiments of the invention or the prior art more clearly, next, a brief introduction will be made for drawings used in the description of the embodiments of the invention or the prior art. Apparently, the drawings described below are just some embodiments of the present invention, other drawings can be obtained from these figures for the skilled person in the art without creative efforts.

DETAILED DESCRIPTION OF EMBODIMENTS

In the following, technical solutions of embodiments of the invention will be described clearly and entirely in connection with figures for embodiments of the invention, to further clarify objects, technical solutions and advantages of embodiments of the invention. Apparently, the embodiments described herein are just a part of embodiments of the invention, rather not the whole embodiments. All other embodiments obtained on the basis of these described embodiments by the skilled person in the art without creative effort belong to the protection scope of the invention.

Figure 1:
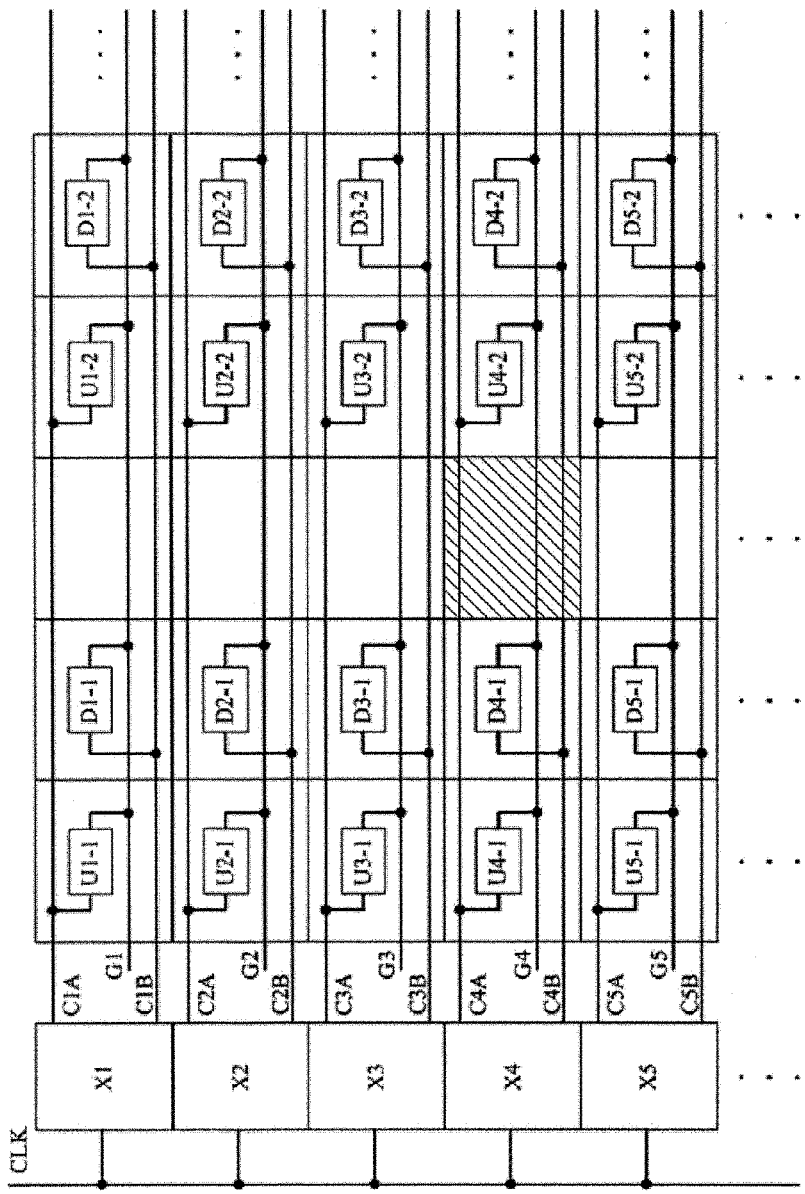
FIG. 1 is a schematic diagram showing positions and structures of pixel units and shifting register units in an array substrate according to an embodiment of the invention.

FIG. 1 schematically shows positions and structures of pixel units and shifting register units in an array substrate according to an embodiment of the invention.

Referring to FIG. 1, an array substrate may comprise a plurality of pixel units (which are not all shown in FIG. 1) arranged in an array. For example, a region denoted by a shade in FIG. 1 is the pixel unit in the fourth row and the third column. FIG. 1 just shows a conventional array of rectangular pixel units by way of example, outer edges of the plurality of pixel units arranged in an array in the above array substrate can also have any other geometrical shapes.

The array substrate also comprises a plurality of shifting register units, each of which corresponds to a row of pixel units. A shifting register unit corresponding to pixel units of any row may comprise a row shared module outside of a display area of the array substrate, an output pull-up module within the display area of the array substrate and an output pull-down module within the display area of the array substrate. Any design for the shifting register circuit of a gate driver in the prior art can be employed as an actual circuit of the shifting register unit of the embodiment, which is not limited by the invention. In an embodiment of the invention, electronic elements for pulling a potential of the gate signal line of pixel units of the row thereof high in the shifting register circuit may constitute the output pull-up module, electronic elements for pulling said potential low in the shifting register circuit may constitute the output pull-down module, and other components can belong to the row shared module. Of course, the row shared module needs to be connected to a gate signal line of pixel units of a previous row in order to achieve the function of the gate driver (other concatenation manners for the shifting register unit such as concatenation across rows can also be used for particular design, which do not depart from the essence of the invention), and the row shared module may need to be connected to a signal from a timing controller (e.g. a clock signal), thus the row shared module may need to be connected with a control signal line such as a clock signal line from an external circuit. Specific external connection thereof can be referenced to the design of the gate driver in the prior art, which is not limited by the present invention.

Herein, since two types of thin film transistor (TFT) can be respectively used to perform the pulling up and pulling down for the potential of the gate signal line, the output pull-up module may comprise a TFT called a pull-up transistor (represented by TU hereinafter), and the output pull-down module may comprise a TFT called a pull-down transistor (represented by TD hereinafter). Specifically, because the gate driver typically has a high requirement for the speed of pulling up and pulling down the potential of the gate signal line, sizes of TU and TD in the shifting register circuit of the gate driver will be greater than those of other TFTs significantly (certainly, the length of shadow of the region where such TFT is located in the row direction of the pixel unit will also be grater than that of other TFT). Therefore, by arranging the output pull-up module comprising TU and the output pull-down module comprising TD within the display area of the array substrate, the length in the row direction outside the display area occupied by the shifting register unit can be greatly reduced, thus facilitating narrowing of the frame.

Next, specific structure of the shifting register unit will be illustrated taking the third line of FIG. 1 as an example.

Referring to FIG. 1, a row shared module X3 in the third row is outside of the display area of the array substrate (X1 to X5 in FIG. 1 respectively represent the row shared modules in the first to the fifth row), and an input of the row shared module X3 is connected with a clock signal line CLK and a previous gate signal line G2 (for the sake of clarity, some connection is not shown in FIG. 1, and G1 to G5 in FIG. 1 represent the gate signal lines in the first row to the fifth row respectively), an output thereof is connected with a pull-up control signal line C3A of the row thereof and a pull-down control signal line C3B of the row thereof (C1A to C5A in FIG. 1 respectively represent the pull-up control signal lines in the first row to the fifth row, and C1B to C5B in FIG. 1 respectively represent the pull-down control signal lines in the first row to the fifth row).

In FIG. 1, the output pull-up module is represented as multiple pull-up sub-modules connected in parallel with each other (e.g., U1-1 to U5-1 represent the first pull-up sub-modules in the first row to the fifth row respectively, U1-2 to U5-2 represent the second pull-up sub-modules in the first row to the fifth row respectively), the output pull-down module is represented as multiple pull-down sub-modules connected in parallel with each other (e.g., D1-1 to D5-1 represent the first pull-down sub-modules in the first row to the fifth row respectively, D1-2 to D5-2 represent the second pull-down sub-modules in the first row to the fifth row respectively). Of course, the output pull-up modules and the output pull-down modules shown in FIG. 1 are just an example, the output pull-up modules and the output pull-down modules of any row within the display area of the array substrate may have any structure and position distribution. However, an output pull-up module of any row may connect with the pull-up control signal line and the gate signal line of the row thereof, and the output pull-down module of any row may connect with the pull-down control signal line and the gate signal line of the row thereof, thereby achieving the function of pulling up and pulling down the potential of the gate signal line by the output pull-up module and the output pull-down module. For example, the pull-up sub-modules U3-1 and U3-2 in the third row of FIG. 1 are both connected with the pull-up control signal line C3A of the row thereof, the pull-down sub-modules D3-1 and D3-2 in the third row of FIG. 1 are both connected with the pull-down control signal line C3B of the row thereof.

It can be seen that, in the embodiment of the invention, a shifting register unit corresponding to a row of pixel units is divided into three parts, i.e. a row shared module, an output pull-up module and an output pull-down module, and the row shared module is arranged outside of the display area of the array substrate, the output pull-up module and output pull-down module are arranged within the display area of the array substrate, which is beneficial for narrowing the area on the circuit board occupied by the gate driver at one side or two sides of the array substrate, thereby it is possible to narrow the frame for obscuring the circuit board. Therefore, the embodiment of the invention can overcome the problem of the gate driver restricting the narrowing for the frame.

Further, in case the output pull-up module comprises the pull-up transistor TU mentioned above and the output pull-down module comprises the pull-down transistor TD, the length in the row direction outside of display area occupied by the shifting register unit can be greatly reduced by means of the embodiment of the invention, thus further facilitating the narrowing of the frame.

However, in the above embodiment, if an output pull-up module and/or an output pull-down module with large sizes are arranged in a single pixel unit, an aperture ratio of the pixel unit will be decreased inevitably, even normal display function may be affected. Therefore, in order to mitigate impact to the aperture ratio as much as possible, an output pull-up/pull-down module with large size may be divided into multiple pull-up/pull-down sub-module with small sizes as shown in FIG. 1, in addition to arranging the output pull-up module and the output pull-down module in different pixel units.

In other words, the output pull-up module may comprise a plurality of pull-up sub-modules arranged in pixel units of the row thereof, each of which is connected with the pull-up control signal line and the gate signal line of pixel units of the row thereof. The output pull-down module may comprise a plurality of pull-down sub-modules arranged in pixel units of the row thereof, each of which is connected with the pull-down control signal line and the gate signal line of pixel units of the row thereof.

For example, as shown in the fourth row of FIG. 1, in the shifting register unit corresponding to pixel units of this row, the output pull-up module may comprise a plurality of pull-up sub-modules such as U4-1 and U4-2 arranged in pixel units of this row, certainly the number of the pull-up sub-modules also can be other positive integers greater than 2; the output pull-down module may comprise a plurality of pull-down sub-modules such as D4-1 and D4-2 arranged in pixel units of this row, certainly the number of the pull-down sub-modules also can be other positive integers greater than 2. Like the pull-up sub-module U4-1 connecting with a pull-up control signal line C4A of the row thereof and a gate signal line G4 of the row thereof, other pull-up sub-modules of this row are also connected to the pull-up control signal line C4A and the gate signal line G4; Like the pull-down sub-module D4-1 connecting with a pull-down control signal line C4B of the row thereof and a gate signal line G4 of the row thereof, other pull-down sub-modules of this row are also connected to the pull-down control signal line C4B and the gate signal line G4.

Hence, taking the output pull-up module as an example (as for the output pull-down module, the case is similar), the whole output pull-up module can be considered to be composed of multiple pull-up sub-modules connected in parallel with each other due to such design, therefore, the function of pulling up electrical potential of the gate signal line can be achieved by the multiple pull-up sub-modules together. For example, in case the output pull-up sub-module comprises the above pull-up transistor TU, the pull-up transistor TU with large size may be divided into multiple sub pull-up transistors TUx of small size connected in parallel with each other, so that multiple sub pull-up transistors TUx can pull up the potential of the gate signal line together under the control of the pull-up control signal, thus requirement for the pulling up speed of the potential of the gate signal line can be ensured by adjusting the size and number of the sub pull-up transistor TUx. Also, instead of arranging a circuit with a large size in a single pixel unit, circuits with a smaller size are arranged in a plurality of pixel units, therefore, impact on the aperture ratio of the pixel unit by the output pull-up module and the output pull-down module can be reduced, and this is beneficial for enhancing brightness uniformity of the multiple pixel units within the whole display area.

Of course, for the above multiple pull-up sub-modules and pull-down sub-modules, specific number and design sizes thereof can be determined depending on the actually desired amplitude and timing sequence of the gate signal. Furthermore, positions of the pull-up sub-modules and pull-down sub-modules can be arranged in different ways according to different number and sizes thereof as well as different application scenarios. More specifically, several optional arrangement manners for the pull-up sub-modules and pull-down sub-modules will be described below in connection with accompanying drawings.

Figure 2:
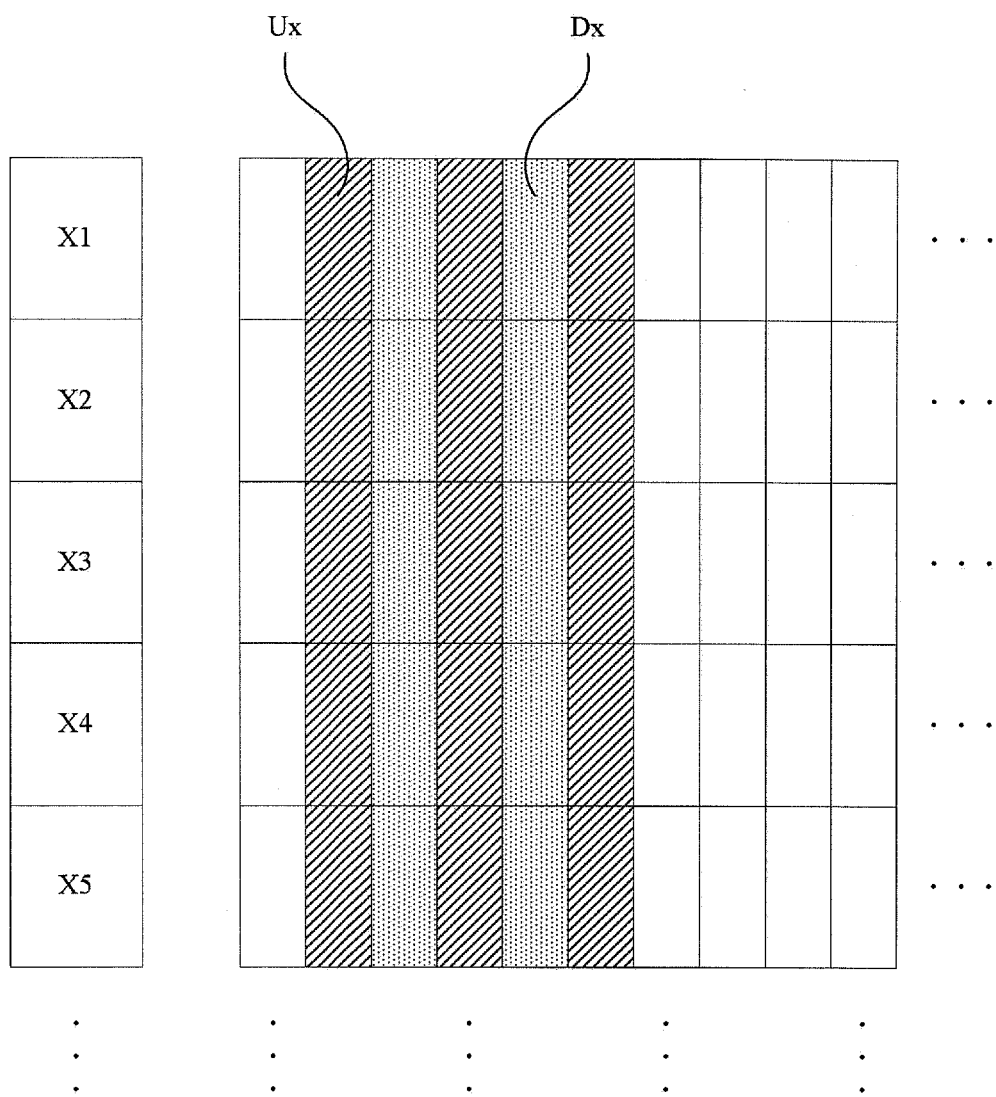
FIG. 2 is a schematic diagram showing an arrangement for the pull-up sub-modules and the pull-down sub-modules according to an embodiment of the invention.

FIG. 2 shows an arrangement for the pull-up sub-modules and pull-down sub-modules according to one embodiment of the invention. Referring to FIG. 2, in a row of pixel units corresponding to a row shared module (e.g. X1 to X5) outside of the display area, there exist multiple pixel units Ux provided with a pull-up sub-module (such as the pixel units provided with pull-up sub-modules U1-1, U3-2 in FIG. 1) and multiple pixel units Dx provided with a pull-down sub-module (such as the pixel units provided with pull-up sub-modules D2-2, D5-1 in FIG. 1). Moreover, columns where the pixel units Ux are provided with a pull-up sub-module and columns where the pixel units Dx are provided with a pull-down sub-module are distributed across multiple columns close to one or two side edges of the array substrate.

With above arrangement solution, in which the pull-up sub-modules and pull-down sub-modules are both close to one side or two sides of the array substrate where the row shared module is provided, the pull-up control signal line and the pull-down control signal line are just provided at the edges of the array substrate without running through the complete row of the array substrate (the length thereof can be reduced). Thus, the embodiment of the invention can save materials and arrangement space in the central portion of the display area. What's more, since the pixel units Ux and Dx are only arranged at the edge of the display area, disadvantageous impact mentioned above will not be induced for the aperture ratio of the pixel units within the central portion of the display area. Solution of this embodiment can be suitable for an application scenario with low requirement for the display effect at the edges of the display area in which fewer pull-up sub-modules and pull-down sub-modules are arranged (which is much less than the number of the pixel units of a row).

Figure 3:
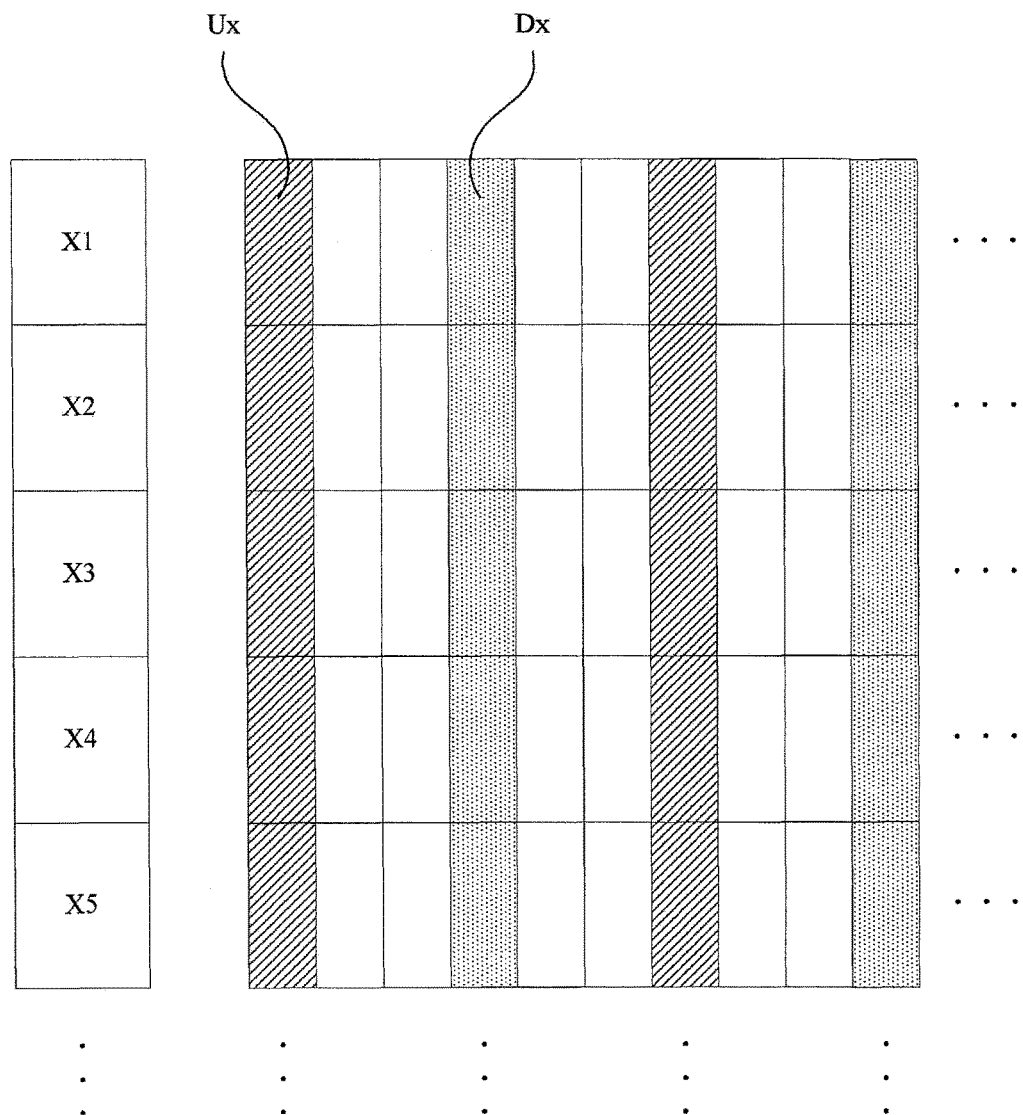
FIG. 3 is a schematic diagram showing an arrangement for the pull-up sub-modules and the pull-down sub-modules according to another embodiment of the invention.

FIG. 3 shows another optional arrangement for the pull-up sub-modules and pull-down sub-modules according to an embodiment of the invention, which has the same reference numbers as FIG. 1. For the arrangement shown in FIG. 3, columns where the pixel units Ux are provided with a pull-up sub-module and columns where the pixel units Dx are provided with a pull-down sub-module are evenly and alternately distributed within the display area of the array substrate. Of course, FIG. 3 just shows an example where alternate pixel units Ux and Dx are spaced by two columns, but other uniform arrangement can be achieved by referencing to this embodiment.

Although aperture ratios of some columns in the display area may be lower than those of other columns, the advantage of above embodiment lies in the fact that overall display effect will not be affected seriously as long as these columns with lower aperture ratios are distributed evenly in the display area, i.e. keeping the difference between these columns and their neighboring columns imperceptible by human's eyes as far as possible (e.g. it is difficult to be observed by human's eyes when density of the pixel units Ux and Dx is low enough and difference in aperture ratios is small enough), thereby mitigating the impact on the brightness uniformity by the problem of lowering aperture ratios mentioned above. Thus, solution of this embodiment can be suitable for an application scenario which needs a higher requirement for the brightness and brightness uniformity within the display area.

On the other hand, for the embodiments shown in FIGS. 2 and 3, a column where a pixel unit Ux is provided with a pull-up sub-module of any row also has pixel units provided with the pull-up sub-module in other rows; and a column where a pixel unit Dx is provided with a pull-down sub-module of any row also has pixel units provided with the pull-down sub-module in other rows, in other words, the pixel units Ux and Dx are both arranged in columns. The advantage of such arrangement is that the relatively low aperture ratios of these pixel units Ux and Dx can be easily corrected by external means due to the concentrated column arrangement of the pixel units Ux and Dx, e.g. the correction can be achieved by adjusting a gamma reference voltage.

Certainly, the pixel units Ux and Dx can also not be arranged in columns, e.g. the strip-shaped uniform arrangement as shown in FIG. 2 can also be altered into point-like uniform arrangement in the whole rectangular display area to achieve better brightness and brightness uniformity.

Figure 4:
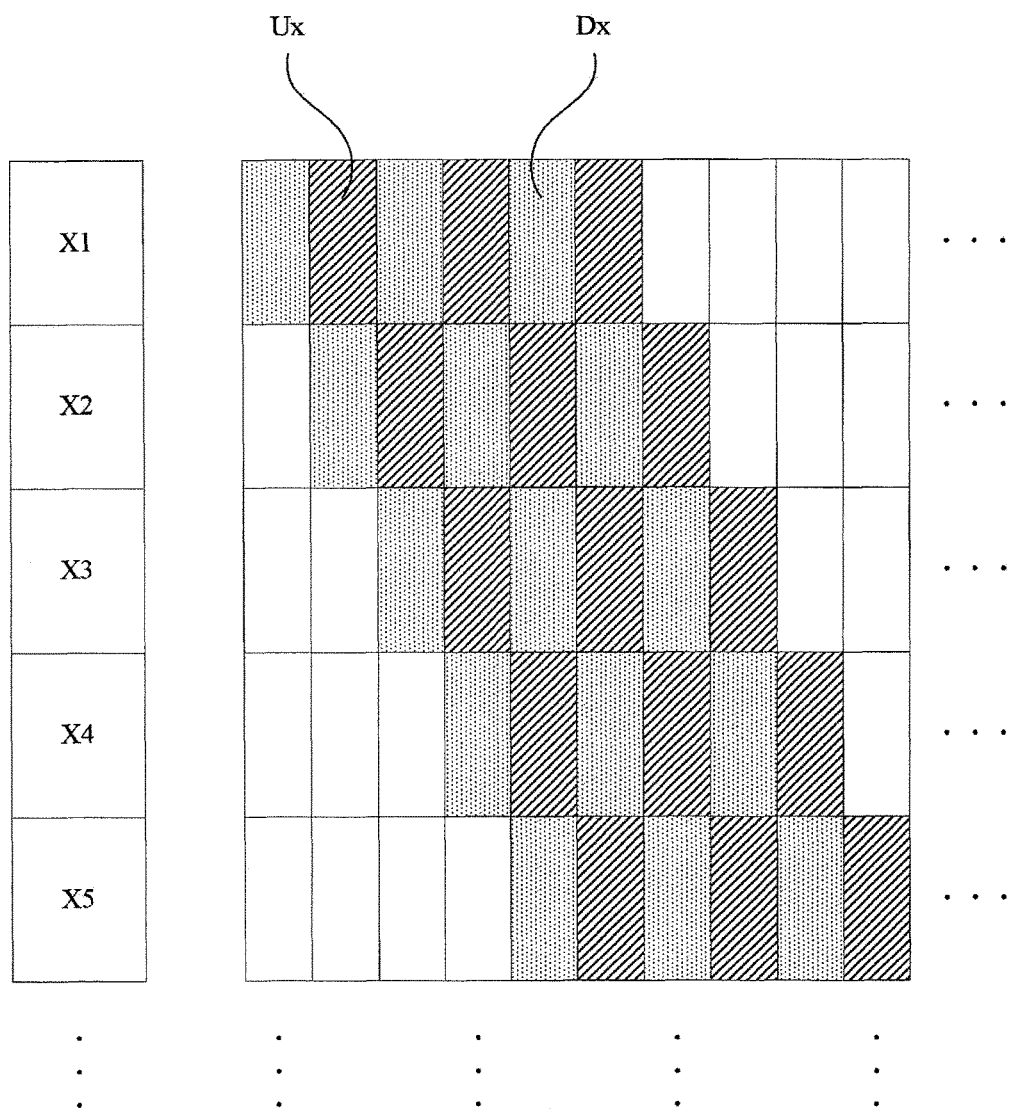
FIG. 4 is a schematic diagram showing an arrangement for the pull-up sub-modules and the pull-down sub-modules according to yet another embodiment of the invention.

FIG. 4 shows another arrangement for the pull-up sub-modules and the pull-down sub-modules in which they are not arranged in columns. For FIG. 4 having the same reference numbers as FIGS. 2 and 3, in a pixel unit of any row, a pull-up sub-module and a pull-down sub-module are arranged alternately in a plurality of consecutive pixel units. Also, among two neighboring rows of pixel units, a column where a pixel unit Ux of a previous row is provided with a pull-up sub-module or a pixel unit Dx of a previous is provided with a pull-down sub-module shifts a predetermined offset of columns towards right or left relative to the column where a pixel unit Ux of the next row is provided with a pull-up sub-module or a pixel unit Dx of the next row is provided with a pull-down sub-module (FIG. 4 shows an example in which the offset is one column). In one embodiment, the columns where a pixel unit Ux of the first row is provided with a pull-up sub-module or a pixel unit Dx of the first row is provided with a pull-down sub-module start from the first column, and the columns where a pixel unit Ux of the last row is provided with a pull-up sub-module or a pixel unit Dx of the last row is provided with a pull-down sub-module end up with the last column, i.e., the whole region of the pixel units Ux and Dx may cover a diagonal line of the display area. Such arrangement with two rows of pixel units alternately arranged can contribute to enhancement for brightness uniformity of the display area. And this embodiment can be suitable for an application scenario where more pull-up sub-modules and pull-down sub-modules are provided.

It can be seen that, for a conventional rectangle display area, any one of the arrangements described above can be applied, however, with respect to an irregular display area of an array substrate, numbers of pixel units in different rows or columns may be different. Therefore, for this particular case, some conditions may need to be satisfied that at least one pixel unit among the pixel units of any row is a pixel unit provided with the pull-up sub-module and at least one pixel unit among the pixel units of any row is a pixel unit provided with the pull-down sub-module. That is to say, any row is at least required to be provided with a pull-up sub-module and a pull-down sub-module to ensure completeness of the shifting register unit of any row.

Figure 5:
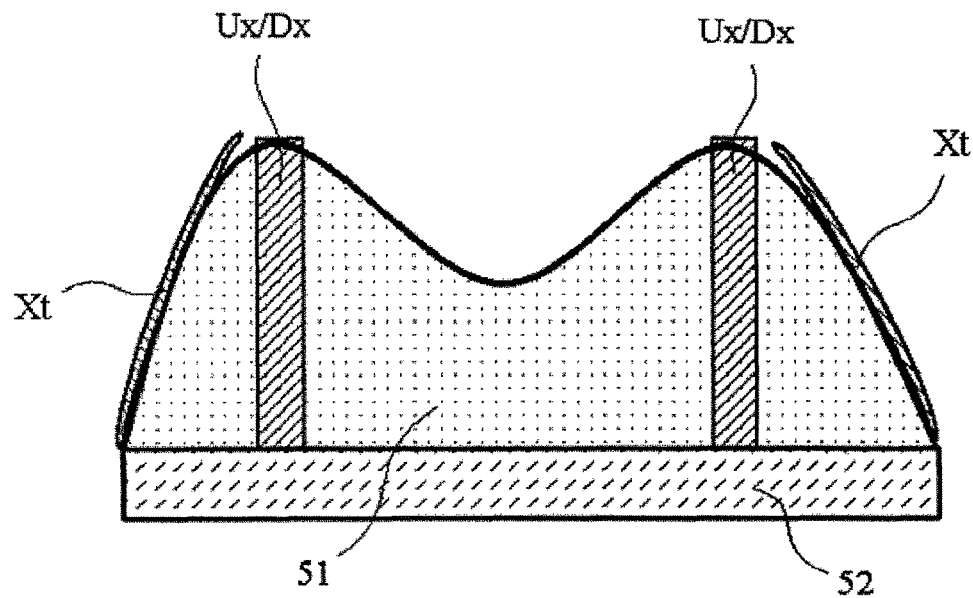
FIG. 5 is a schematic diagram showing an arrangement for the pull-up sub-modules and the pull-down sub-modules within an irregular display area according to another embodiment of the invention.

For example, FIG. 5 illustrates an arrangement for the pull-up sub-modules and the pull-down sub-modules in an irregular display area according to an embodiment of the invention. In FIG. 5, a display area 51 roughly has a shape of the Chinese character "凹", and a circuit board 52 has a data driver is arranged at one side of the display area 51 (e.g., the bottom side thereof in FIG. 5). Then according to solutions described above, a row shared module Xt (which may include the row shared modules X1 to X5 shown in FIG. 1) should be arranged at other side or sides of the display area 51 (e.g., they are arranged at the right and left sides of the display area in FIG. 5). In order to ensure completeness of the shifting register unit, at least one column of pixel units Ux and pixel units Dx need to be overlapped with all rows in the display area when arranging pixel units Ux and Dx in columns as described above. For example, in FIG. 5, a pixel unit Ux and a pixel unit Dx can be arranged at two shadow regions that can overlap with all rows in the display area 51.

In the embodiments described above, the plurality of pull-up modules or the plurality of pull-down modules may be modules with the same structure and size, and may also have different structures and sizes. However, in general, all of the plurality of pull-up modules or the plurality of pull-down modules can be modules with the same structure and size, so as to enhance the brightness uniformity and simplify process as far as possible.

It should be understood that, specific circuit structure of the shifting register unit that can be applied to the invention can be a variety of circuits as known by the skilled in the art, which is not limited by the invention. However, for specific circuit structure of certain shifting register unit, for purpose of simplifying the circuit structure, specific relationship embodied among the row shared module, the pull-up module and the pull-down module may differ from that embodied in foregoing embodiments.

Figure 6:
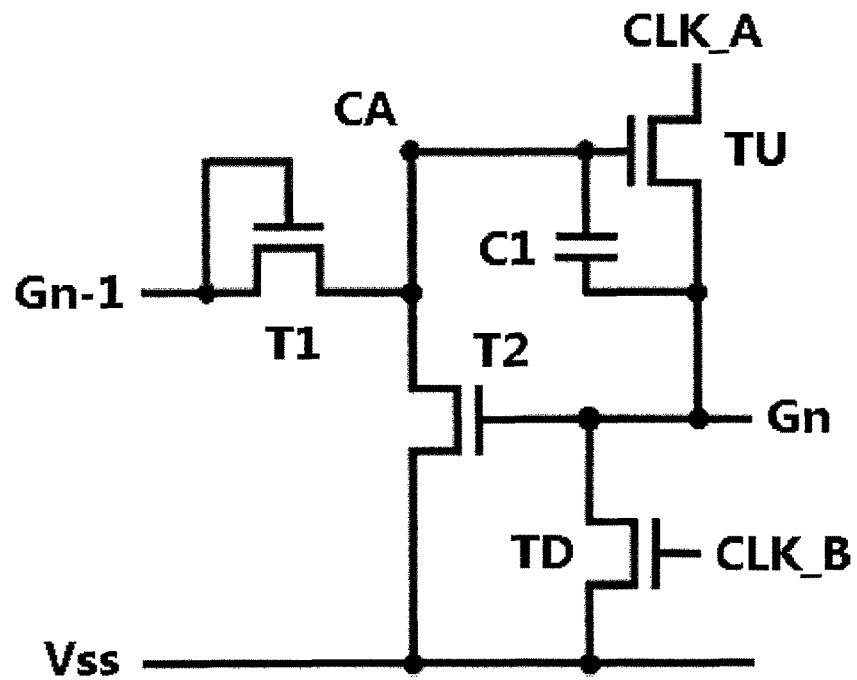
FIG. 6 is a schematic diagram showing the circuit structure of a shifting register unit according to another embodiment of the invention.

For example, FIG. 6 shows a structural diagram of a circuit of the shifting register unit according to another embodiment of the invention. In the circuit of the shifting register unit shown in FIG. 6, the clock signal lines CLK comprise a first clock signal line CLK_A and a second clock signal line CLK_B, signal phases of which may differ by half cycle.

Specifically, as to the $n^{th}$ row of shifting register unit (n is a positive integer), the pull-up sub-module may comprise a pull-up transistor TU and a capacitor C1. And the gate of the pull-up transistor TU is connected with the pull-up control signal line of pixel units of the row thereof (in FIG. 6, a node CA is shown), one of the source and drain thereof is connected with the gate signal line Gn of pixel units of the row thereof, the other one is connected with the first clock signal line CLK_A of the clock signal lines above. One end of the capacitor is connected with the pull-up control signal line of pixel units of the row thereof (node CA), and the other end is connected with the gate signal line Gn of pixel units of the row thereof mentioned above. With such circuit structure, the potential of the gate signal line Gn can be pulled up by the pull-up transistor TU under the control of the voltage signal of the pull-up control signal line (i.e., at the node CA). Of course, it can be understood that other circuit structures can be employed to achieve this function.

The pull-down sub-module may comprise a pull-down transistor TD. The gate of the pull-down transistor TD is connected with the pull-down control signal line of pixel units of the row thereof (in this embodiment, a signal provided by the second clock signal line CLK_B in the clock lines can be used as the pull-down control signal, thus the pull-down control signal line is represented as CLK_B), and one of the source and drain thereof is connected with a low level line Vss, the other one is connected with the gate signal line Gn of pixel units of the row thereof. With such circuit structure, the potential of the gate signal line Gn can be pulled down by the pull-down transistor TD under the control of the voltage signal of the pull-down control signal line (herein, i.e. the second clock signal line CLK_B). Of course, it can be understood that other circuit structures can be employed to achieve this function.

The row shared module may comprise a first transistor T1 and a second transistor T2. Wherein the gate of the first transistor T1 is connected to the gate signal line Gn−1 of pixel units of the previous row, one of the source and drain is connected to the pull-up control signal line (node CA) of pixel units of the row thereof, and the other one is connected with the gate signal line Gn−1 of pixel units of the previous row (i.e., the first transistor T1 is connected to act like a diode). The gate of the second transistor T2 is connected to the gate signal line Gn of pixel units of the row thereof (hence, in this embodiment, the second transistor T2 can be controlled by means of the gate signal provided by the gate signal line Gn), one of the drain and source is connected with the low level line Vss, and the other one is connected with the pull-up control signal line of pixel units of the row thereof (node CA). The second clock signal line CLK_B in the clock lines is used as the pull-down control signal line of pixel units of the row thereof mentioned above. The row shared module in such circuit structure can provide the pull-up control signal to the pull-up sub-module through the pull-up control signal line, and provide the pull-down control signal to the pull-down sub-module through the pull-down control signal line according to the voltage signal of the gate signal line Gn−1 of pixel units of the previous row and the signal of the clock signal lines.

It is noted that, any one of the transistors mentioned above can be an n-type thin film transistor (TFT) or a p-type thin film transistor. The connection manner as to the drain and source of any TFT mentioned above can be determined depending on whether the TFT is of n-type or of p-type. In case of a n-type TFT, the upper end of the TFT in FIG. 6 is the drain, and the lower end thereof is the source; in case of a p-type TFT, the upper end of the TFT in FIG. 6 is the source, and the lower end thereof is the drain.

Of course, the circuit structure shown in FIG. 6 is just an example of the circuit of the shifting register unit, its timing sequence and working principle can be easily understood by the skilled in the art, which will not be described in detail herein.

Figure 7:
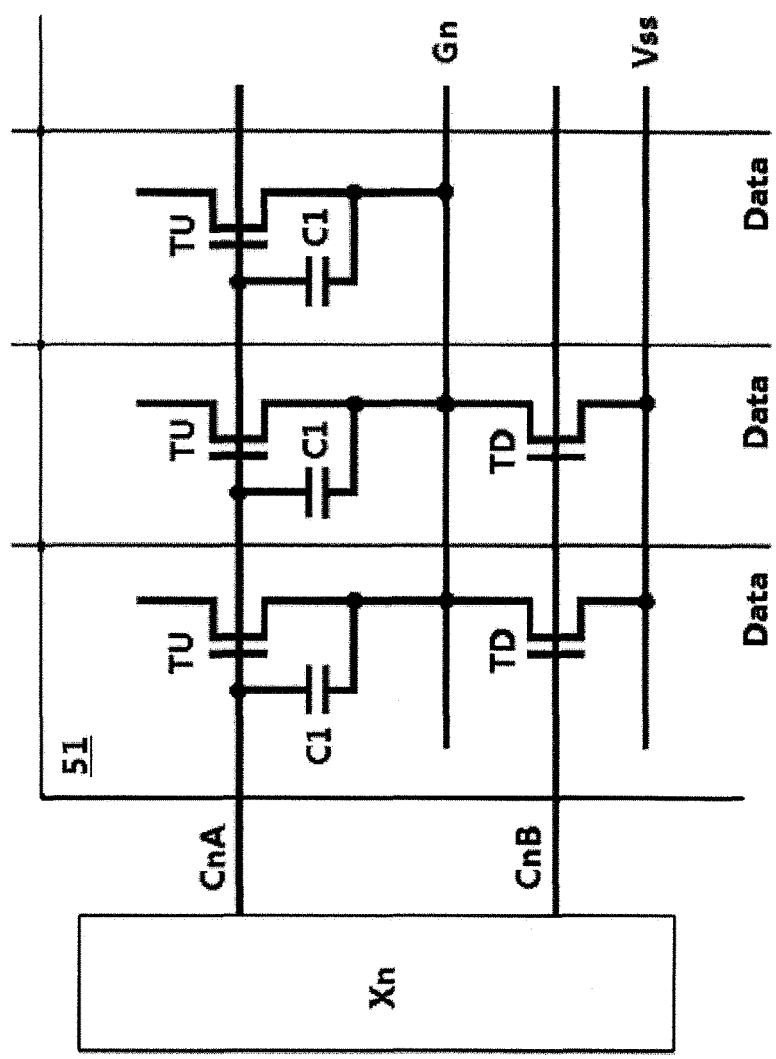
FIG. 7 is a schematic diagram showing the circuit structure of the shifting register unit on an array substrate according to another embodiment of the invention.

Based on the circuit structure of the shifting register unit described above, the structure of the shifting register units arranged on the array substrate is schematically shown in FIG. 7. In FIG. 7, the $n^{th}$ row of shifting register unit includes a row shared unit Xn outside of the display area 51 of the array substrate and a plurality of pull-up sub-modules (comprising the pull-up transistor TU and the capacitor C1) within the display area 51 as well as a plurality of pull-down sub-modules (comprising the pull-down transistor TD) within the display area 51. Wherein the gate of the pull-up transistor TU in each pull-up sub-module is connected to the pull-up control signal line CnA of pixel units of the row thereof, one of the drain and source is connected to the gate signal line Gn of pixel units of the row thereof, the other one is connected to the first clock signal line CLK_A (which is not shown in FIG. 7, and can be extended from the row shared unit Xn, or also can be originated from other circuit modules) in the clock signal lines. One end of the capacitor C1 is connected to the pull-up control signal line CnA of pixel units of the row thereof, the other end is connected to the gate signal line Gn of pixel units of the row thereof. The gate of the pull-down transistor TD in each pull-down sub-module is connected to the pull-down control signal line CnB of pixel units of the row thereof, one of the drain and source is connected to the low level line Vss, the other one is connected to the gate signal line Gn of pixel units of the row thereof. Of course, FIG. 7 is just a schematic diagram of the structure of the shifting register unit arranged on the array substrate, the arrangement for the pull-up sub-modules and the pull-down sub-modules can be referenced to the embodiments described above.

Taking the circuit structure of the shifting register unit described above as an example, in the array substrate, the length of the pull-up transistor TU along the row direction may be of the order of 1000 micrometers, the length of the pull-down transistor TD along the row direction may be of the order of 1000 micrometers, whereas the lengths of other TFTs along the row direction may be of the order of 10 or 100 micrometers. Thus, in this embodiment, the pull-up transistor TU and the pull-down transistor TD with relatively large sizes are arranged within the display area of the array substrate, thereby significantly reducing the length along the row direction of the circuit structure outside of the display area (which may be decreased from original 1000 micrometers range to 10 or 100 micrometers range), and facilitating reduction of the area occupied by the gate driver on the circuit board at one side or two sides of the array substrate, therefore, the frame for obscuring the circuit board can be narrowed. Thus, embodiments of the invention can mitigate effectively the problem of the gate driver restricting the narrowing for the frame.

Based on the same inventive concept, an embodiment of the invention provides a display device, which may comprise any one of array substrates provided by embodiments above. The display device can be various products or components capable of displaying designed based on GOA, such as a display panel, an electronic paper, a cellular phone, a tablet, a television, a laptop, a digital photo frame and a navigator. However, any one of the array substrates mentioned above is especially suitable for a top-emitting organic light emitting diode (OLED) display device, since in such display device, TFTs arranged on the array substrate are below the light emitting area, thus the aperture ratio of the pixel unit will not be affected by the output pull-up modules and the output pull-down modules, accordingly, particular designs are not required for the arrangement of the pull-up or pull-down sub-modules. Moreover, since anyone of the display devices mentioned above may comprise anyone of the array substrates above, the technical features and problem to be solved as well as technical effect to be achieved about the display devices are corresponding to those of the array substrates, which will not be repeated herein.

In conclusion, for the array substrates and display devices provided by embodiments of the invention, a shifting register unit corresponding to a row of pixel units is divided into three parts of a row shared module, an output pull-up module and an output pull-down module, and the row shared module is arranged outside of the display area of the array substrate, the output pull-up module and the output pull-down module are arranged within the display area of the array substrate, which is beneficial for reducing the area of the gate driver on the circuit board at one side or two sides of the array substrate, thereby narrowing the frame for obscuring the circuit board. Thus, embodiments of the invention can overcome the problem of the gate driver restricting the narrowing for the frame.

It is noted that, in description for embodiments of the invention, orientations or positional relationships indicated by terms such as "up" or "below" are based on what is shown in the accompanying drawings. Thus, such terms are convenient for the description of the embodiments of the invention and intended to simplify the description, rather not indicating or implying that elements or components referred to must have particular orientations or have to be structured and operated in particular orientation. Therefore, they are not intended to limit present invention. Unless defined or specified explicitly, terms such as "install", "connect" and "join" should be comprehended in a broad sense, e.g., they may mean a fixed connection, a removable connection or an integral connection; also, they may mean a mechanical connection or a electrical connection; further, they may mean a direct connection, a indirect connection through a intermediate medium or internal connection between two elements. Specific meaning of the terms mentioned above in the embodiments of the invention can be understood by the skilled person in the art depending on particular case.

It is also noted that, herein relationship terms such as "first" and "second" are just intended to distinguish one entity or operation from another entity or operation, and it is not necessarily to require or suggest any actual relationship or order among these entities or operations. Moreover, terms "include" and "comprise" or any other inflections thereof are meant to cover nonexclusive inclusion, therefore, a process, a method, an article or a device comprising a series of elements not only comprise such elements, but also may comprise other elements not listed explicitly, or may comprise some inherent elements in the process, method, article or device. An element defined by phrase of "comprise a . . . " without any other definition does not exclude additional same elements existing in the process, method, article or device including the element.

Above embodiments are just used for explaining example solutions of the invention, rather not limiting the invention. Although detailed description for the forgoing embodiments has been completed by way of example, it should be understood by the skilled in the art that, modifications can be made for the solutions recited by the forgoing embodiments or some technical features thereof can be replaced equivalently, but such modifications or replacements will not cause corresponding technical solutions to depart from the spirits and scopes of the technical solution of respective embodiments of the invention.

The invention claimed is:

1. An array substrate comprising a plurality of pixel units arranged in an array and a plurality of shifting register units, each shifting register unit corresponding to a row of pixel units, wherein a shifting register unit corresponding to pixel units of any row comprises:

a row shared module outside of a display area of the array substrate, an input of which is connected with clock signal lines and a gate signal line of pixel units of a previous row, and an output of which is connected with a pull-up control signal line of pixel units of the row thereof and a pull-down control signal line of pixel units of the row thereof;

an output pull-up module within the display area of the array substrate, which is connected to the pull-up control signal line of pixel units of the row thereof and a gate signal line of pixel units of the row thereof;

an output pull-down module within the display area of the array substrate, which is connected to the pull-down control signal line of pixel units of the row thereof and the gate signal line of pixel units of the row thereof, wherein the output pull-up module corresponding to pixel units of any row comprises multiple pull-up sub-modules arranged in the pixel units of the row thereof, each pull-up sub-module connecting with the pull-up control signal line of pixel units of the row thereof and the gate signal line of pixel units of the row thereof; the output pull-down module corresponding to pixel units of any row comprises multiple pull-down sub-modules arranged in the pixel units of the row thereof, each pull-down sub-module connecting with the pull-down control signal line of pixel units of the row thereof and the gate signal line of pixel units of the row thereof, wherein a column where a pixel unit provided with the pull-up sub-module of any row exists also has pixel units provided with the pull-up sub-module in other rows; and a column where a pixel unit provided with the pull-down sub-module of any row exists also has pixel units provided with the pull-down sub-module in other rows, or, wherein in a pixel unit of any row, the pull-up sub-module and the pull-down sub-module are arranged alternately in a plurality of consecutive pixel units;

wherein among two neighboring rows of pixel units, a column where a pixel unit of the previous row provided with the pull-up sub-module or the pull-down sub-module exist shifts a predetermined offset of columns towards right or left relative to the column where a pixel unit of the next row provided with the pull-up sub-module or the pull-down sub-module exist;

wherein columns where a pixel unit of the first row provided with the pull-up sub-module or the pull-down sub-module exists start from the first column, columns where a pixel unit of the last row provided with the pull-up sub-module or the pull-down sub-module exists end up with the last column.

2. The array substrate according to claim 1, wherein columns where pixel units provided with the pull-up sub-module exist and columns where pixel units provided with the pull-down sub-module exist are evenly and alternately distributed within the display area of the array substrate.

3. The array substrate according to claim 2, wherein when the display area of the array substrate has a irregular shape, at least one pixel unit among the pixel units of any row is a pixel unit provided with the pull-up sub-module and at least one pixel unit among the pixel units of any row is a pixel unit provided with the pull-down sub-module.

4. The array substrate according to claim 2, wherein the pull-up sub-module comprises a pull-up transistor and a capacitor, the gate of the pull-up transistor is connected with the pull-up control signal line of pixel units of the row thereof, one of the source and drain is connected with the gate signal line of pixel units of the row thereof, the other one is connected with a first clock signal line of the clock signal lines, and one end of the capacitor is connected with the pull-up control signal line of pixel units of the row thereof, the other end is connected with the gate signal line of pixel units of the row thereof.

5. The array substrate according to claim 1, wherein columns where pixel unit provided with the pull-up sub-module exist and columns where pixel units provided with the pull-down sub-module exist are distributed across multiple columns close to one or two side edges of the array substrate.

6. The array substrate according to claim 5, wherein when the display area of the array substrate has a irregular shape, at least one pixel unit among the pixel units of any row is a pixel unit provided with the pull-up sub-module and at least one pixel unit among the pixel units of any row is a pixel unit provided with the pull-down sub-module.

7. The array substrate according to claim 5, wherein the pull-up sub-module comprises a pull-up transistor and a capacitor, the gate of the pull-up transistor is connected with the pull-up control signal line of pixel units of the row thereof, one of the source and drain is connected with the gate signal line of pixel units of the row thereof, the other one is connected with a first clock signal line of the clock signal lines, and one end of the capacitor is connected with the pull-up control signal line of pixel units of the row thereof, the other end is connected with the gate signal line of pixel units of the row thereof.

8. The array substrate according to claim 1, wherein when the display area of the array substrate has a irregular shape, at least one pixel unit among the pixel units of any row is a pixel unit provided with the pull-up sub-module and at least one pixel unit among the pixel units of any row is a pixel unit provided with the pull-down sub-module.

9. The array substrate according to claim 1, wherein when the display area of the array substrate has a irregular shape, at least one pixel unit among the pixel units of any row is a pixel unit provided with the pull-up sub-module and at least one pixel unit among the pixel units of any row is a pixel unit provided with the pull-down sub-module.

10. The array substrate according to claim 1, wherein the pull-up sub-module comprises a pull-up transistor and a capacitor, the gate of the pull-up transistor is connected with the pull-up control signal line of pixel units of the row thereof, one of the source and drain is connected with the gate signal line of pixel units of the row thereof, the other one is connected with a first clock signal line of the clock signal lines, and one end of the capacitor is connected with the pull-up control signal line of pixel units of the row thereof, the other end is connected with the gate signal line of pixel units of the row thereof.

11. The array substrate according to claim 10, wherein the pull-down sub-module comprise a pull-down transistor, the gate of the pull-down transistor is connected with the pull-down control signal line of pixel units of the row thereof, and one of the source and drain is connected with a low level line, the other is connected with the gate signal line of pixel units of the row thereof.

12. The array substrate according to claim 11, wherein the row shared module comprises a first transistor and a second transistor, wherein the gate of the first transistor is connected to the gate signal line of pixel units of the previous row, one of the source and drain is connected to the pull-up control signal line of pixel units of the row thereof, and the other is connected with the gate signal line of pixel units of the previous row;

wherein the gate of the second transistor is connected to the gate signal line of pixel units of the row thereof, one of the drain and source is connected with the low level line, and the other is connected with the pull-up control signal line of pixel units of the row thereof;

and wherein a second clock signal line of the clock lines is connected with the pull-down control signal line of pixel units of the row thereof.

13. The array substrate according to claim 1, wherein the pull-up sub-module comprises a pull-up transistor and a capacitor, the gate of the pull-up transistor is connected with the pull-up control signal line of pixel units of the row thereof, one of the source and drain is connected with the gate signal line of pixel units of the row thereof, the other one is connected with a first clock signal line of the clock signal lines, and one end of the capacitor is connected with the pull-up control signal line of pixel units of the row thereof, the other end is connected with the gate signal line of pixel units of the row thereof.

14. The array substrate according to claim 1, wherein the pull-up sub-module comprises a pull-up transistor and a capacitor, the gate of the pull-up transistor is connected with the pull-up control signal line of pixel units of the row thereof, one of the source and drain is connected with the gate signal line of pixel units of the row thereof, the other one is connected with a first clock signal line of the clock signal lines, and one end of the capacitor is connected with the pull-up control signal line of pixel units of the row thereof, the other end is connected with the gate signal line of pixel units of the row thereof.

15. A display device, wherein the display device comprises an array substrate according to claim 1.

16. The display device according to claim 15, wherein the display device is a top-emitting organic light emitting diode display device.

\* \* \* \* \*